(12) United States Patent
Wang

(10) Patent No.: US 7,349,613 B2
(45) Date of Patent: Mar. 25, 2008

(54) PHOTONIC CRYSTAL DEVICES INCLUDING GAIN MATERIAL AND METHODS FOR USING THE SAME

(75) Inventor: Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/338,305

(22) Filed: Jan. 24, 2006

(65) Prior Publication Data

US 2007/0172183 A1   Jul. 26, 2007

(51) Int. Cl.
   *G02B 6/10*   (2006.01)
(52) U.S. Cl. ..................................... 385/129
(58) Field of Classification Search .............. None
   See application file for complete search history.

(56) References Cited

U.S. PATENT DOCUMENTS

| | | | |
|---|---|---|---|
| 6,826,223 B1* | 11/2004 | Meyer et al. ............... | 372/96 |
| 6,878,969 B2 | 4/2005 | Tanaka et al. | |
| 6,917,055 B2 | 7/2005 | Stegmuller | |
| 6,943,377 B2 | 9/2005 | Gaska et al. | |
| 6,958,494 B2 | 10/2005 | Lin et al. | |
| 2002/0172820 A1* | 11/2002 | Majumdar et al. .......... | 428/357 |
| 2004/0056243 A1 | 3/2004 | Atanackovic et al. | |
| 2004/0091224 A1* | 5/2004 | Baumberg et al. .......... | 385/129 |
| 2004/0247009 A1 | 12/2004 | Noda et al. | |
| 2005/0018734 A1 | 1/2005 | Sugitatsu et al. | |
| 2005/0029536 A1 | 2/2005 | Sugitatsu et al. | |
| 2005/0063438 A1 | 3/2005 | Capasso et al. | |
| 2005/0111804 A1* | 5/2005 | Bjarklev et al. ............ | 385/125 |
| 2005/0158898 A1 | 7/2005 | Scherer | |
| 2006/0066493 A1* | 3/2006 | Wang ......................... | 343/754 |

OTHER PUBLICATIONS

U.S. Appl. No. 10/949,158, filed Sep. 24, 2004, entitled "Externally Powered Negatively Refracting Photonic Bandgap Medium," by Shih-Yuan Wang.
Inoshita, Kyoji, et al., Room-Temperature Lasing Characteristics of Bend and Branch in Photonic Crystal Waveguide, Jpn. J. Appl. Phys. vol. 42 (2003), pp. 6887-6891.

(Continued)

*Primary Examiner*—Sung Pak
*Assistant Examiner*—Hoang Tran

(57) ABSTRACT

A device includes a photonic crystal having a plurality of voids disposed in a periodic lattice throughout a dielectric material. Each void is at least partially defined by a surface of the dielectric material. The photonic crystal also includes a waveguide. Gain material is disposed within at least one void located proximate the waveguide. The gain material may emit radiation having a wavelength within a photonic bandgap of the photonic crystal and corresponding to an allowable mode of the waveguide. A method for coupling radiation to a waveguide includes providing a photonic crystal having a plurality of voids disposed in a periodic lattice throughout a dielectric material and a waveguide. Each void is at least partially defined by at least one surface of the dielectric material. Gain material is provided within at least one void located proximate the waveguide and stimulated to emit electromagnetic radiation.

19 Claims, 8 Drawing Sheets

OTHER PUBLICATIONS

Joannopoulos, John D., et al., "Photonic Crystals, Molding the Flow of Light," Appendix D, pp. 127-129, Princeton University Press, Princeton, NJ, 1995.

Loncar, Marko, et al., "Low-threshold photonic crystal laser," Appl. Phys. Lett., vol. 81, No. 15, Oct. 7, 2002, pp. 2680-2682.

Painter, O.J., et al., "Room Temperature Photonic Crystal Defect Lasers at Near-Infrared Wavelengths in InGaAsP," Journal of Lightwave Technology, vol. 17, No. 11, Nov. 1999, pp. 2082-2088.

* cited by examiner

PHOTONIC CRYSTAL DEVICES INCLUDING GAIN MATERIAL AND METHODS FOR USING THE SAME

FIELD OF THE INVENTION

The present invention relates to photonic crystals. More particularly, the invention relates to devices that include a photonic crystal having a waveguide and gain material for providing electromagnetic radiation within the waveguide. The invention also relates to methods for coupling electromagnetic radiation to a waveguide.

BACKGROUND OF THE INVENTION

Photonic crystals are a new class of man-made materials. They are often referred to as "metamaterials." Photonic crystals are formed by dispersing a material of one dielectric constant periodically within a matrix having a different dielectric constant. A one-dimensional photonic crystal is a three-dimensional structure that exhibits periodicity in dielectric constant in only one dimension. Bragg mirrors are an example of a one-dimensional photonic crystal. To form a Bragg mirror, alternating thin layers having different dielectric constants and refractive indices are stacked on top of one another. The combination of several thin layers forms a three-dimensional structure that exhibits periodicity in dielectric constant in only the direction orthogonal to the planes of the thin layers. No periodicity is exhibited in either of the two dimensions contained within the plane of the layers.

A two-dimensional photonic crystal can be formed by periodically dispersing rods or columns of a material of one dielectric constant within a matrix having a different dielectric constant. Two-dimensional photonic crystals may exhibit periodicity in dimensions perpendicular to the length of the rods, but no periodicity is exhibited in the direction parallel to the length of the rods.

Finally, a three-dimensional photonic crystal can be formed by periodically dispersing small spheres or other spatially confined areas of a first material having a first dielectric constant within a matrix of a second material having a second, different, dielectric constant. Three-dimensional photonic crystals may exhibit periodicity in dielectric constant in all three dimensions within the crystal.

Photonic crystals may exhibit a photonic bandgap over a range of wavelengths in directions exhibiting periodicity in dielectric constant. In other words, there may be a range of wavelengths of electromagnetic radiation that will not be transmitted through the photonic crystal in the directions exhibiting periodicity in dielectric constant. This range of wavelengths that are not transmitted is known as a photonic bandgap of the photonic crystal. No photonic bandgap is exhibited in directions that do not exhibit periodicity in dielectric constant.

When defects are introduced into the periodic dielectric structure of a photonic crystal, localized electromagnetic modes may be allowed at wavelengths within the photonic bandgap. For example, resonant cavities have been formed in photonic crystals by introducing point defects into the periodic dielectric structure, and waveguides have been formed in photonic crystals by introducing line defects into the periodic dielectric structure.

Photonic crystal devices that include waveguides have been provided with gain material to provide light emitting devices. Such light emitting devices are useful in optical communication and optical information processing applications. However, a significant quantity of electromagnetic radiation generated by gain material in known light-emitting photonic crystal devices is not effectively coupled to the waveguide.

BRIEF SUMMARY OF THE INVENTION

In one aspect, the present invention includes a device that includes a photonic crystal having a plurality of voids disposed in a periodic lattice throughout a dielectric material. Each void of the plurality of voids is at least partially defined by at least one surface of the dielectric material. The photonic crystal also includes a waveguide. The device further includes gain material disposed within at least one void located proximate the waveguide.

In another aspect, the present invention includes a device that includes a two-dimensional photonic crystal having a plurality of voids disposed in a lattice in the layer of dielectric material. The layer of dielectric material has a first major surface and a second major surface, and each void of the plurality of voids extends through the layer of dielectric material between the first major surface and the second major surface. The photonic crystal further includes a linear defect in the lattice defining a waveguide. The device also includes at least one structure comprising gain material disposed within each void of a plurality of voids located proximate the waveguide. The gain material is configured to emit electromagnetic radiation upon stimulation. The electromagnetic radiation has a wavelength that is within a photonic bandgap of the photonic crystal and corresponds to an electromagnetic mode that is allowable within the waveguide.

In another aspect, the present invention includes a device that includes a two-dimensional photonic crystal having a substrate and a plurality of rods extending from a surface of the substrate. The plurality of rods is disposed in a lattice on the surface of the substrate, and each rod includes a dielectric material. The photonic crystal further includes a linear defect in the lattice defining a waveguide. The device also includes at least one structure comprising gain material disposed on a lateral surface of each rod of a plurality of rods located proximate the waveguide. The gain material is configured to emit electromagnetic radiation upon stimulation. The electromagnetic radiation has a wavelength that is within a photonic bandgap of the photonic crystal and corresponds to an electromagnetic mode that is allowable within the waveguide.

In yet another aspect, the present invention includes a method for coupling electromagnetic radiation to a waveguide. The method includes providing a photonic crystal having a plurality of voids disposed in a periodic lattice throughout a dielectric material and a waveguide extending therethrough. Each void of the plurality of voids is at least partially defined by at least one surface of the dielectric material. The method further includes providing a gain material within at least one void located proximate the waveguide that is configured to emit electromagnetic radiation upon stimulation. The electromagnetic radiation emitted by the gain material has a wavelength that is within a photonic bandgap of the photonic crystal and corresponds to an electromagnetic mode that is allowable within the waveguide. The gain material is stimulated to emit electromagnetic radiation.

The features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

The illustrations presented herein are not meant to be actual views of any particular photonic crystal device or system, but are merely idealized representations which are employed to describe various aspects of the present invention. Additionally, for ease of discussion, elements common between figures may retain the same numerical designation.

The term "gain material" as used herein means any material that is capable of emitting electromagnetic radiation upon stimulation. Stimulation may be provided by, for example, electromagnetic radiation (optical pumping) or electrical current (carrier injection).

The term "nanoparticle" as used herein means a particle of any shape having cross-sectional dimensions of less than about 100 nanometers. Examples of nanoparticles include, but are not limited to, nanodots (including quantum dots), nanowires, nanolines, nanocolumns, and nanospheres.

The term "waveguide" as used herein means any spatially confined region in a structure in which at least one wavelength of electromagnetic radiation will propagate in selected directions. Waveguides may include, but are not limited to, linear defects in photonic crystals.

Figure 1:
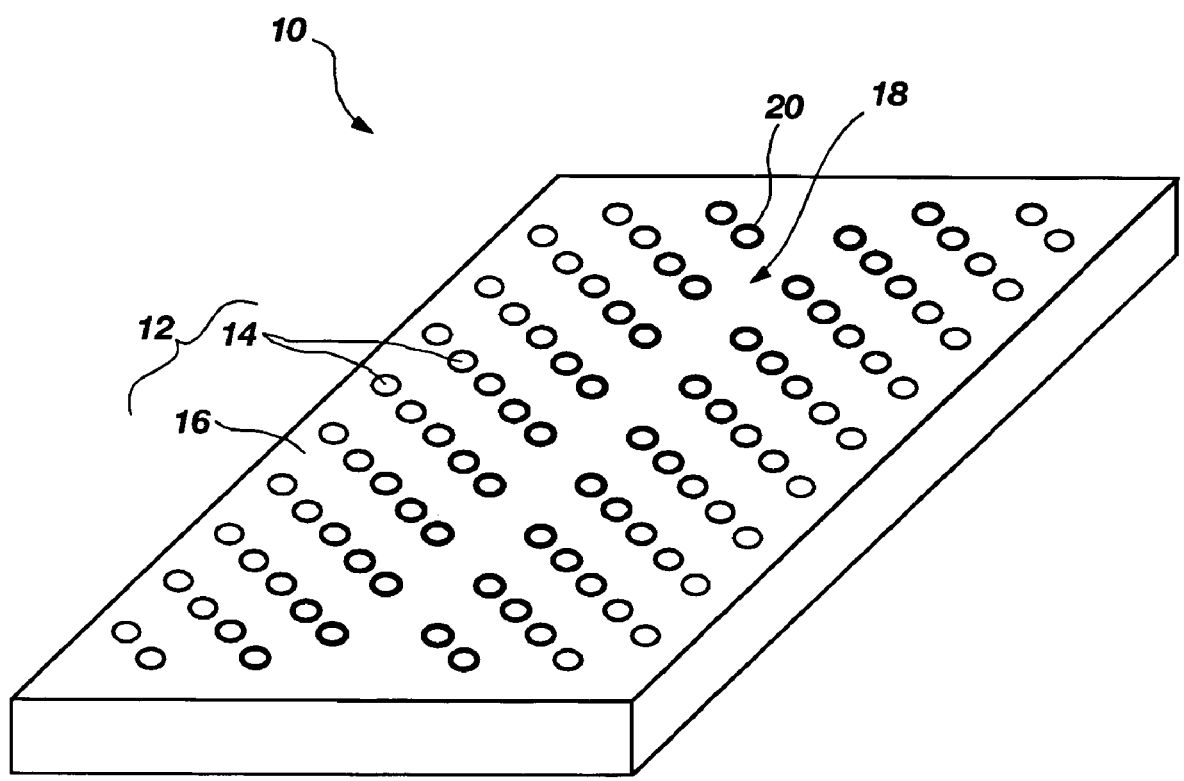
FIG. 1 is a perspective view of a representative photonic crystal device that embodies teachings of the present invention.

A photonic crystal device 10 that embodies teachings of the present invention is shown in FIG. 1. The photonic crystal device 10 includes a two-dimensional (2D) photonic crystal 12 having a plurality of voids 14 in a dielectric material 16. The voids 14 may be arranged in a periodic array or lattice throughout the dielectric material 16. Each void 14 of the plurality of voids 14 may be at least partially defined by at least one surface of the dielectric material 16. The dielectric material 16 may be substantially homogenous throughout the photonic crystal 12. At least one waveguide 18 may extend through the photonic crystal 12. The photonic crystal device 10 further includes gain material 20 disposed within at least one void 14 that is located proximate the waveguide 18 of the photonic crystal 12. The gain material 20 is represented by darker or bolder lines forming the voids 14. Voids 14 containing relatively more gain material 20 are represented by relatively darker or bolder lines relative to the lines forming voids 14 containing relatively less gain material 20. The gain material 20 is discussed in further detail below.

Figure 2:
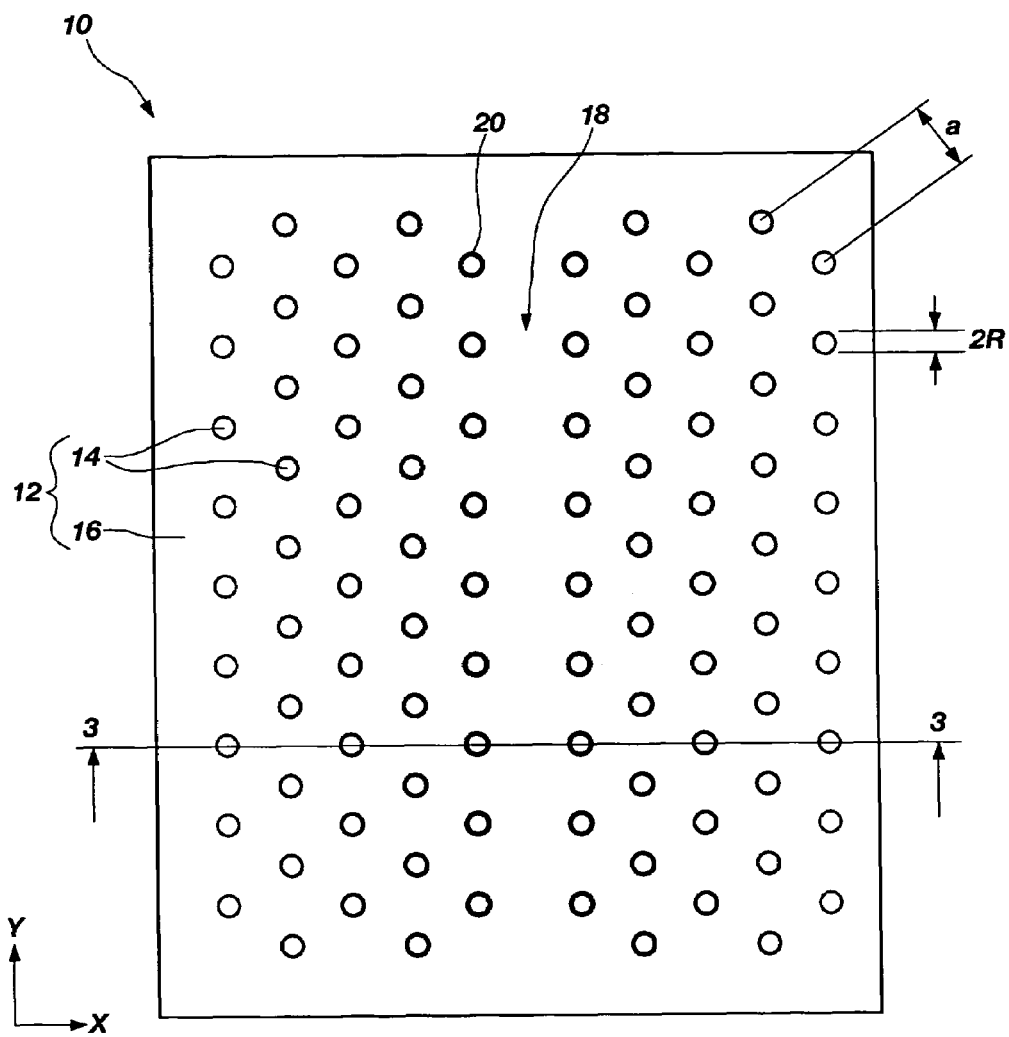
FIG. 2 is a plan view of the photonic crystal device shown in FIG. 1.

Referring to FIG. 2, each void 14 of the photonic crystal 12 may have a substantially cylindrical shape. Alternatively, each void 14 may have any other shape such as, for example, any shape forming a prism (a space figure having two congruent, parallel bases that are polygons (triangles, rectangles, pentagons, etc.)). Furthermore, each void 14 of the plurality of voids 14 may have a uniform radius R. The plurality of voids 14 of the photonic crystal 12 may be configured in what may be referred to as a triangular lattice. The triangular lattice may have a lattice constant a defined as the distance separating the center of one void 14 from the center of adjacent voids 14. By way of example and not limitation, the ratio of the uniform radius R of the cylindrically shaped voids 14 to the lattice constant a of the photonic crystal 12 (i.e., R/a) may be in a range from about 0.2 to about 0.5 in a triangular lattice configuration.

The dielectric material 16 exhibits a dielectric constant that differs from a dielectric constant exhibited within the voids 14. In one representative embodiment of the invention, the dielectric material 16 may exhibit a dielectric constant of about 11.4 and the voids 14 may exhibit a dielectric constant of about 1. For example, the dielectric material 16 may be formed from a semiconductor material such as GaAs and the voids 14 may include air. Such a structure may be formed by etching the cylindrically shaped voids 14 in a layer of GaAs using known lithographic techniques such as, for example, masking and etching. Alternatively, chemical etch or plasma enhanced dry etching can be employed to form the voids 14. Where chemical etching is performed, the voids may not have isotropic vertical walls, but may be elliptically shaped with sloped walls. Where such a result occurs, dry etching can provide a more vertical isotropic slope. In this configuration, dielectric periodicity may be exhibited through the photonic crystal 12 in directions within the XY plane.

The waveguide 18 that extends through the photonic crystal 12 may include a linear defect in the lattice of voids 14. For example, the waveguide 18 may comprise a missing row of voids 14 in the lattice of voids 14. Alternatively, the waveguide 18 may comprise a row of voids 14 in the lattice of voids 14 having larger or smaller radii than the uniform radius R of the other voids 14 of the photonic crystal 12.

The photonic crystal 12 may exhibit a photonic bandgap over a range of wavelengths of electromagnetic radiation. Certain electromagnetic modes at wavelengths within the photonic bandgap may be allowed within the waveguide 18. Determining the photonic band structure of a particular photonic crystal is a complex problem that involves solving the Maxwell equations considering the periodic variation in the dielectric constant through the photonic crystal. Thus, the photonic band structure is at least partially a function of the dielectric constant of the dielectric material 16, the dielectric constant of the voids 14, the uniform radius R, and the lattice constant a. Computational methods for computing the band structure of a particular photonic crystal are known in the art. An explanation of these computational methods may be found in John D. Joannopoulas, Robert D. Meade & Joshua N. Winn, *Photonic Crystals—Molding the Flow of Light*, (Princeton University Press 1995), in particular at Appendix D, the contents of which are incorporated herein by reference.

Figure 3:
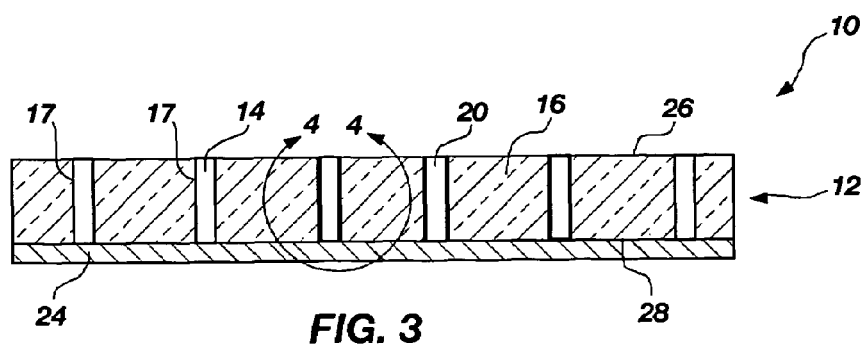
FIG. 3 is a cross-sectional view of the photonic crystal device shown in FIGS. 1-2 taken along section line 3-3 in FIG. 2.

As previously discussed, the photonic crystal device 10 further includes gain material 20 disposed within at least one void 14 that is located proximate the waveguide 18 of the photonic crystal 12. The gain material 20 is represented in FIGS. 1-3 by darker or bolder lines forming the voids 14. Voids 14 containing relatively more gain material 20 are represented by relatively darker or bolder lines relative to the lines forming voids 14 containing relatively less gain material 20. The gain material 20 may be configured to emit electromagnetic radiation having at least one particular wavelength upon stimulation. The at least one particular wavelength of electromagnetic radiation emitted by the gain material 20 may be within the photonic bandgap of the photonic crystal 12, but may correspond to an allowable mode within the waveguide 18. In other words, electromagnetic radiation emitted by the gain material 20 may be substantially prevented from passing through the photonic crystal 12 in directions within the XY plane, unless the electromagnetic radiation is traveling along the waveguide 18.

Voids 14 located in rows closer to the waveguide 18 may include a greater quantity of gain material 20 than voids 14 located in rows farther from the waveguide 18. The gain material 20 may include a semiconductor material doped with erbium ions, GaAs based materials, InP based materials, Nd glass, Er in glass, or any other III-V semiconductor material suitable for use as gain material. Many such materials are known in the art and may be used to provide devices embodying the present invention. In other embodiments of the present invention, the gain material 20 may include other materials or molecules such as, for example, Rhodamine 6G.

FIG. 3 is a cross-sectional view of the photonic crystal device 10 taken along section line 3-3 shown in FIG. 2. As seen therein, the dielectric material 16 may be configured as a substantially planar layer having a first major surface 26 and a second major surface 28. Each void 14 of the plurality of voids 14 may be at least partially defined by a cylindrical surface 17 of the dielectric material 16. The photonic crystal device 10 may further include a substrate 24. The substrate may be formed from, for example, silica or a semiconductor material such as GaAs or InP. The photonic crystal 12 may be fabricated on or in a surface of such a substrate 24. Each void 14 may extend through the dielectric material 16 to a surface of the substrate 24. Furthermore, each void 14 may extend entirely through the dielectric material 16 and the substrate 24.

Figure 4:
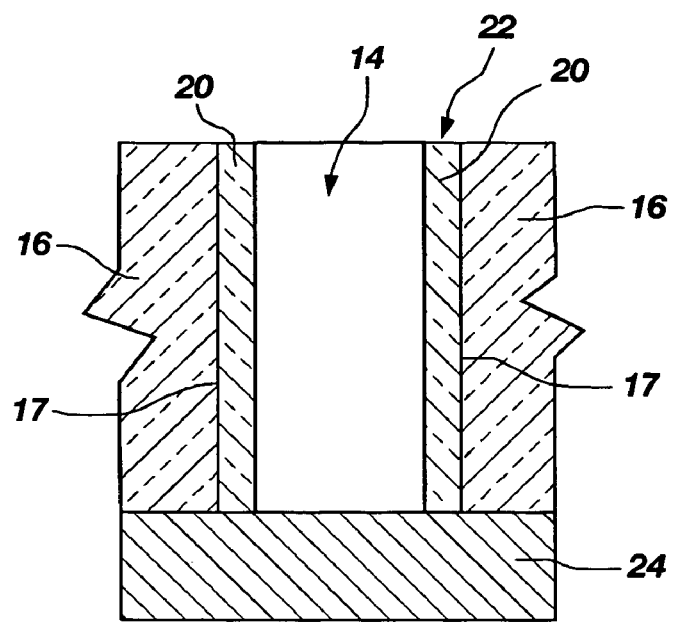
FIG. 4 is an enlarged partial view of a portion of the photonic crystal device shown in FIG. 3.

FIG. 4 is an enlarged partial view of a portion of the photonic crystal device 10 illustrating in greater detail a void 14 of the photonic crystal 12. As shown in FIG. 4, the gain material 20 may be disposed in a layer 22 on the cylindrically shaped surfaces 17 defining each void 14. Furthermore, the layer 22 of gain material 20 may entirely cover the cylindrically shaped surfaces 17 defining each void 14. Alternatively, the gain material 20 may cover only a portion of the cylindrically shaped surfaces 17 defining each void 14, or the gain material 20 could substantially fill each void 14. The gain material 20 may also be disposed on a surface of the substrate 24 within each void 14.

The gain material 20 may be provided within the voids 14 by, for example, suspending the gain material 20 in a liquid, providing the suspension in the voids 14, and allowing the liquid to evaporate leaving behind the gain material 20 within the voids 14. Alternatively, the gain material 20 may be provided within the voids 14 by, for example, providing the gain material 20 as or in a polymerizable material, providing the polymerizable material in the voids 14, and polymerizing the material within the voids 14. Additionally, layers of material including gain material 20 may be epitaxially grown using known techniques such as, for example, organometallic vapor phase epitaxy (OMVPE).

Figure 5:
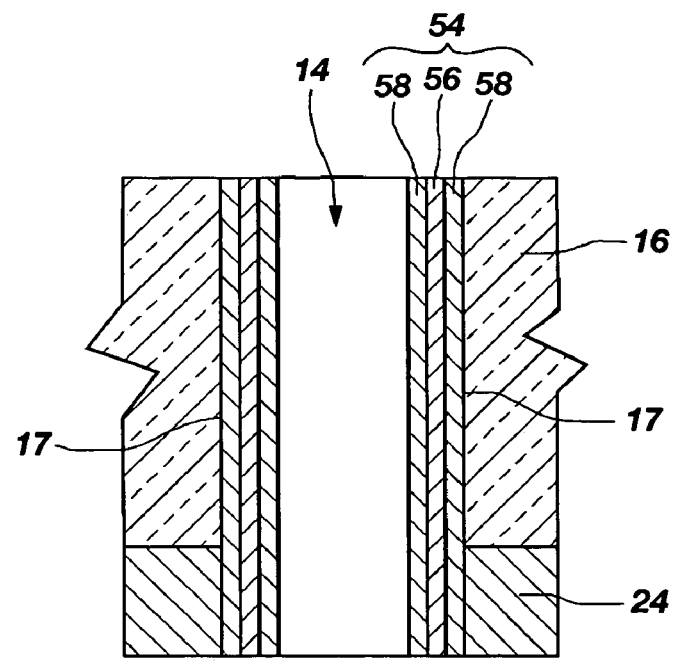
FIG. 5 is an enlarged partial view illustrating a portion of another representative photonic crystal device that embodies teachings of the present invention.

In one representative embodiment of the present invention, the photonic crystal device 10 may include a plurality of quantum well structures 54 disposed within a plurality of voids 14 located proximate the waveguide 18, as shown in FIG. 5. For example, some voids 14 located proximate the waveguide 18 may include a quantum well structure 54 lining the cylindrical surface 17 of the dielectric material 16 defining each void 14. As seen in FIG. 5, each quantum well structure 54 may include a single active layer 56 that includes gain material disposed between two layers of cladding material 58.

Figure 6:
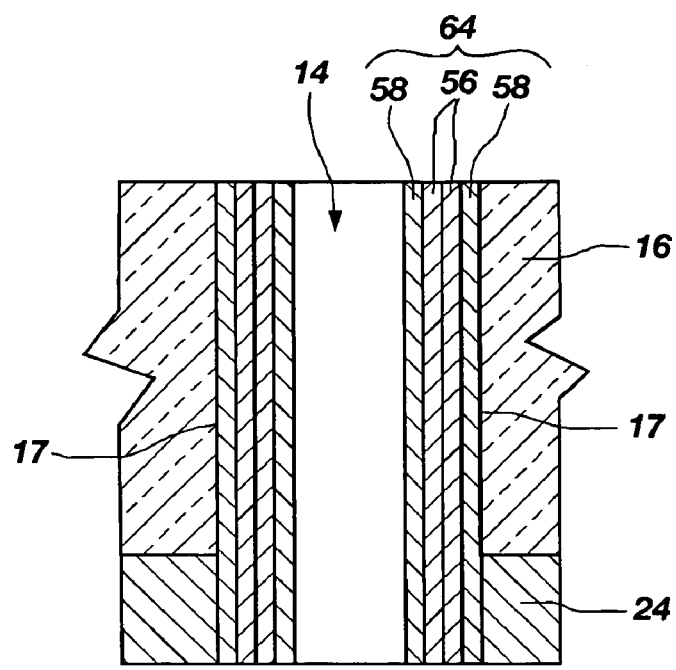
FIG. 6 is an enlarged partial view illustrating a portion of another representative photonic crystal device that embodies teachings of the present invention.

In another representative embodiment of the present invention shown in FIG. 6, the photonic crystal device 10 may include a plurality of multiple quantum well structures 64 disposed within a plurality of voids 14 located proximate the waveguide 18. For example, some voids 14 located proximate the waveguide 18 may include a multiple quantum well structure 64 lining the cylindrical surface 17 of the dielectric material 16 defining each void 14. As seen in FIG. 6, each multiple quantum well structure 64 may include two or more active layers 56 that each includes gain material. The two or more active layers 56 may be disposed between two layers of cladding material 58.

As previously described, voids 14 located closer to the waveguide 18 may contain more gain material 20 relative to voids 14 located farther from the waveguide 18. By way of example and not limitation, each void 14 of the plurality of voids 14 that contain gain material 20 may include a multiple quantum well structure 64 wherein the number of active layers 56 is defined by the equation $N=X-r$ (for all values of r less than or equal to X, otherwise $N=0$), where N is the number of active layers 56 in the multiple quantum well structure 64 of a particular void 14, X is an integer representing a maximum number of active layers 56 in any multiple quantum well structure 64 within a void 14, and r is an integer representing the number of rows between the particular void 14 and the waveguide 18. Therefore, the multiple quantum well structures 64 in voids 14 in rows immediately adjacent the waveguide 18 will have a number of active layers 56 equal to X, the multiple quantum well structures 64 in voids 14 in the next closest rows to the waveguide 18 will have X-1 active layers 56, and so forth. The voids 14 in rows located such that X or more rows are located between those rows and the waveguide 18 will not have any quantum well structure 54 or multiple quantum well structure 64 disposed therein. In this configuration, a photonic crystal device may be provided wherein more gain material 20 is disposed within voids 14 located closer to the waveguide 18 than in voids 14 located farther from the waveguide 18.

Figure 7:
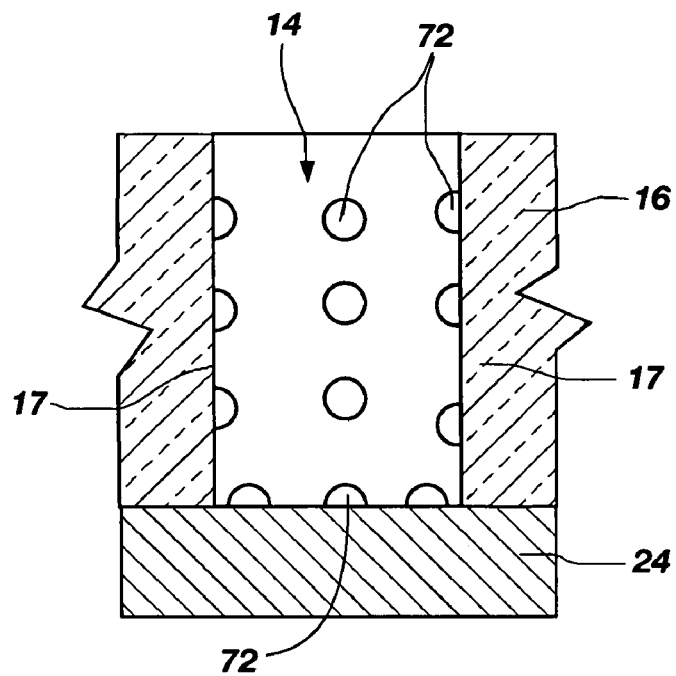
FIG. 7 is an enlarged partial view illustrating a portion of another representative photonic crystal device that embodies teachings of the present invention.

In another embodiment of the present invention shown in FIG. 7, the photonic crystal device 10 may include a plurality of nanoparticles 72 disposed within a plurality of voids 14 located proximate the waveguide 18. Each nanoparticle 72 includes gain material 20. Furthermore, each nanoparticle 72 may be configured as a quantum dot disposed on a surface within a void 14 such as, for example, a cylindrical surface 17 of the dielectric material 16 or a surface of the substrate 24 within a void 14. The quantum dots 72 may be provided within the voids 14 by, for example, depositing a quantity of gain material 20 on surfaces inside the voids 14 that is insufficient to completely cover the surfaces inside the voids 14. The photonic crystal device 10 then may be subjected to elevated temperatures at which the nanoparticles 72 will self-assemble.

Figure 8:
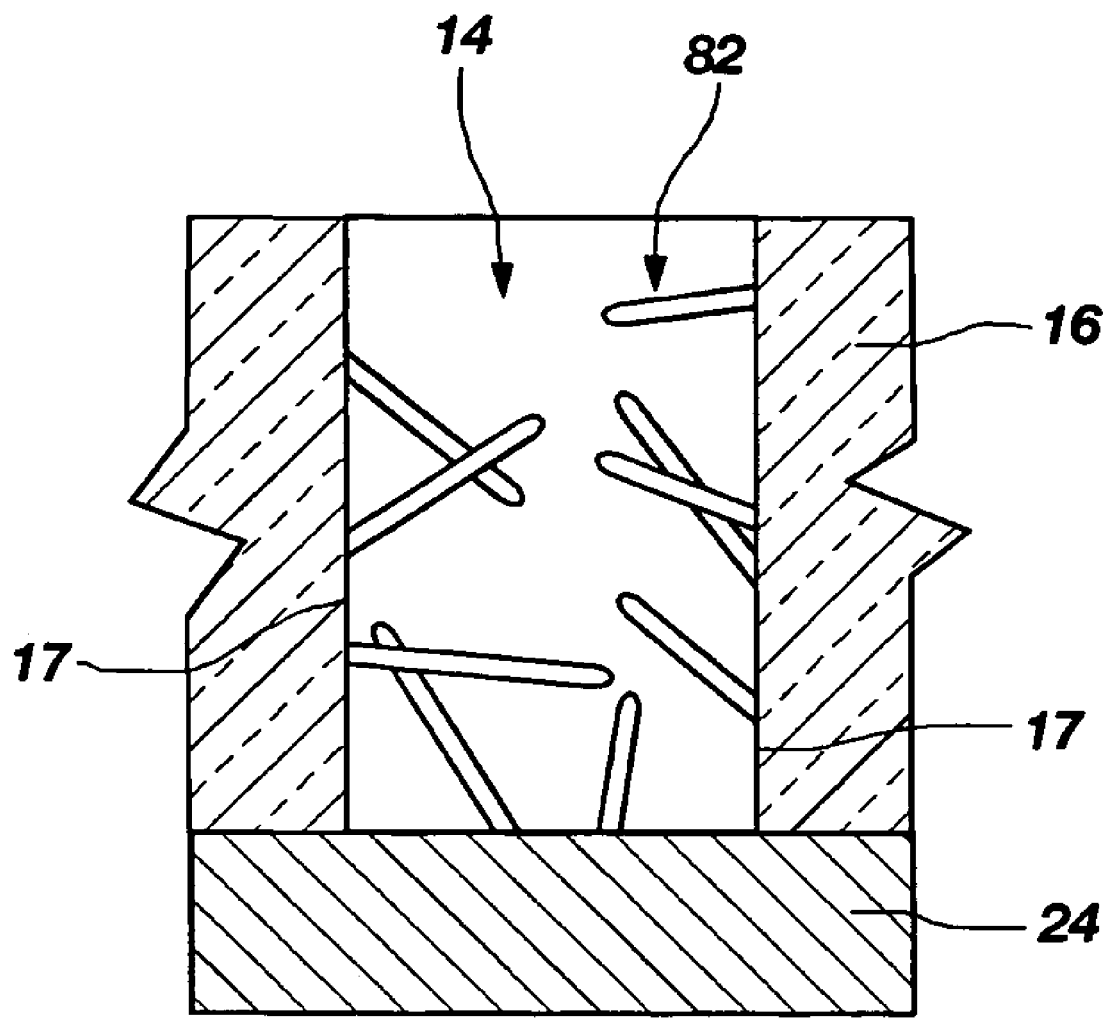
FIG. 8 is an enlarged partial view illustrating a portion of another representative photonic crystal device that embodies teachings of the present invention.

In yet another representative embodiment of the present invention shown in FIG. 8, the photonic crystal device 10 may include a plurality of nanowires 82 disposed within a plurality of voids 14 located proximate the waveguide 18. Each nanowire 82 includes gain material 20. Each nanowire 82 may include, for example, GaN, InP, or any III-V semiconductor material. By way of example and not limitation, the nanowires may be produced by depositing a sub-monatomic layer of catalyst material on at least one surface within at least some voids 14. The catalyst material may be, for example, cobalt, gold, iron, nickel, silver, or titanium depending on the material of the nanowires 82 to be formed and the particular growth mechanism. The sub-monatomic layer may then be annealed at elevated temperatures to promote self-assembly of small nanoparticles of catalyst material on the surfaces within the voids 14. The nanowires 82 may then be synthesized on the surfaces within the voids 14 using chemical vapor deposition or a vapor phase transport process employing a vapor-liquid-solid (VLS) mechanism. Nanowires 82 growth or synthesis may only occur at each discrete region of catalyst material. For example, a Ga-containing precursor gas and anhydrous $NH_3$ may be flowed over gold catalyst nanoparticles at elevated temperatures (about 900° C.) to synthesize GaN nanowires by thermal chemical vapor deposition. Such Ga-containing precursor gases for chemical vapor deposition are commercially available.

In addition to forming the nanowires 82 within the voids 14, the nanowires 82 may be pre-formed and subsequently provided within the voids 14. The nanowires 82 may be provided in the voids 14 by, for example, suspending the nanowires 82 in a carrier fluid (not shown), dispersing the carrier fluid and nanowires 82 into the voids 14, and evaporating the carrier fluid leaving the nanowires 82 in the voids 14. Alternatively, the nanowires 82 may be provided within the voids 14 by suspending the nanowires 82 in a polymerizable fluid, providing the polymerizable fluid and nanowires 82 within the voids 14, and polymerizing the polymerizable fluid within the voids 14.

Furthermore, more nanowires 82 may be provided in voids 14 located closer to the waveguide 18 than in voids 14 located farther from the waveguide 18. In this configuration, more gain material 20 is disposed within voids 14 located closer to the waveguide 18 than in voids 14 located farther from the waveguide 18. It is also understood that varying amounts of gain material 20 may be provided to different voids 14 at various locations in the photonic crystal device 10.

Each of the previously described photonic crystal devices were described as including a photonic crystal 12 having a plurality of voids 14 arranged in a triangular lattice throughout the dielectric material 16. In alternative embodiments of the present invention, photonic crystals may be employed that have voids 14 arranged in other configurations throughout the dielectric material 16.

Figure 9:
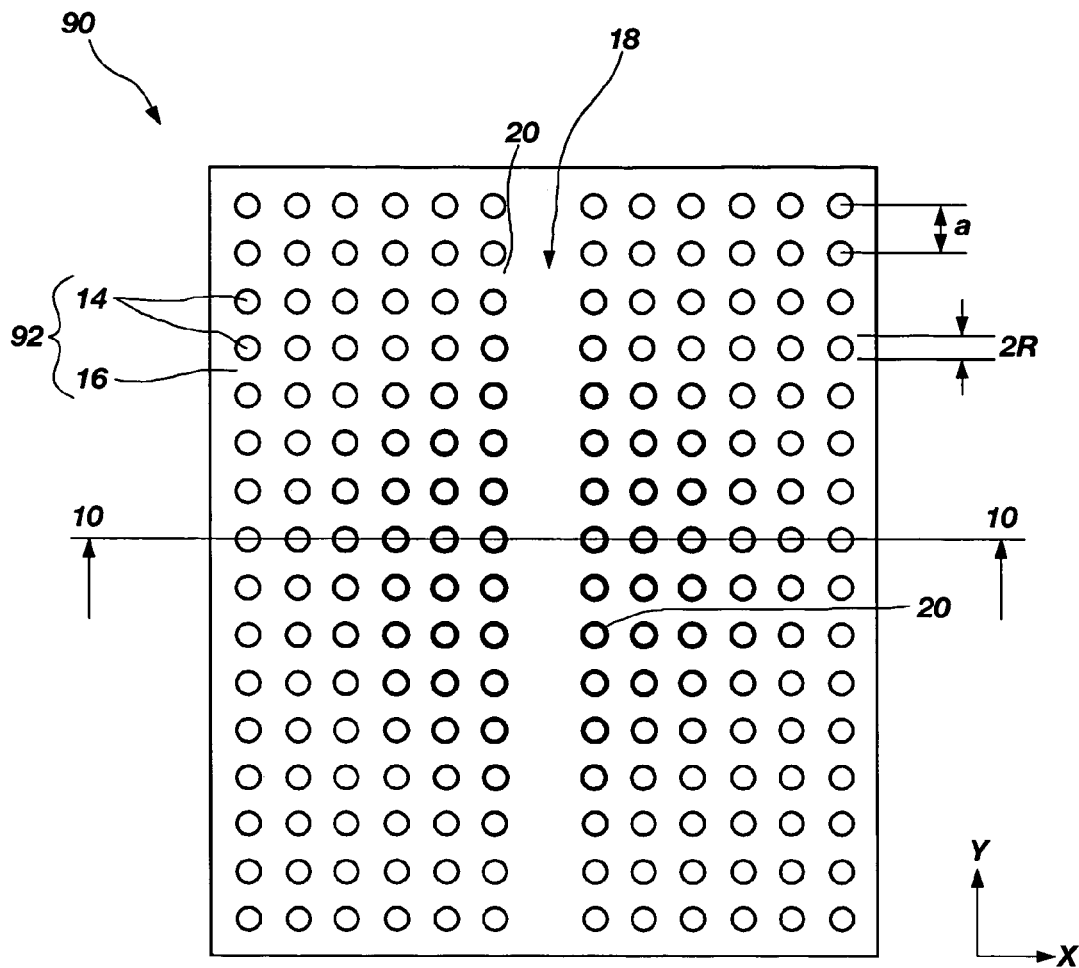
FIG. 9 is a plan view of another representative photonic crystal device that embodies teachings of the present invention.

Another photonic crystal device 90 that embodies teachings of the present invention is shown in FIG. 9. The photonic crystal device 90 includes a two-dimensional (2D) photonic crystal 92 having a plurality of voids 14 in a dielectric material 16. The voids 14 may be disposed in a square lattice throughout the dielectric material 16. Each void 14 of the plurality of voids 14 may be at least partially defined by at least one surface of the dielectric material 16. The dielectric material may be substantially homogenous throughout the photonic crystal 92. At least one waveguide 18 may extend through the photonic crystal 92. The photonic crystal device 90 further includes gain material 20 disposed within at least one void 14 that is located proximate the waveguide 18 of the photonic crystal 92. The gain material 20 is represented by darker or bolder lines forming the voids 14. Voids 14 containing relatively more gain material 20 are represented by relatively darker or bolder lines relative to the lines forming voids 14 containing relatively less gain material 20. The gain material 20 may be provided within the voids 14 proximate the waveguide 18 in any of the manners previously described herein in relation to the photonic crystal device 10 and FIGS. 1-8.

Referring to FIG. 9, each void 14 of the photonic crystal 92 may have a substantially cylindrical shape. Furthermore, each void 14 of the plurality of voids 14 may have a uniform radius R. The square lattice may have a lattice constant a defined as the distance separating the center of one void 14 from the center of adjacent voids 14. By way of example and not limitation, the ratio of the uniform radius R of the cylindrically shaped voids 14 to the lattice constant a of the photonic crystal 92 (i.e., R/a) may be in a range from about 0.4 to about 0.6 in a square lattice configuration.

The dielectric material 16 exhibits a dielectric constant that differs from a dielectric constant exhibited within the voids 14. In one representative embodiment of the invention, the dielectric material 16 may exhibit a dielectric constant of about 11.4 and the voids 14 may exhibit a dielectric constant of about 1. For example, the dielectric material 16 may be formed from a semiconductor material such as GaAs and the voids 14 may include air. Such a structure may be formed by etching the cylindrically shaped voids 14 in a layer of GaAs using known lithographic techniques such as, for example, masking and etching. In this configuration, dielectric periodicity may be exhibited through the photonic crystal 92 in directions within the XY plane.

The waveguide 18 that extends through the photonic crystal 92 may include a linear defect in the lattice of voids 14. For example, the waveguide 18 may comprise a missing row of voids 14 in the lattice of voids 14. Alternatively, the waveguide 18 may comprise a row of voids 14 in the lattice of voids 14 having larger or smaller radii than the uniform radius R of the other voids 14 of the photonic crystal 92.

The photonic crystal 92 may exhibit a photonic bandgap over a range of wavelengths of electromagnetic radiation. Certain electromagnetic modes at wavelengths within the photonic bandgap may be allowed within the waveguide.

Figure 10:
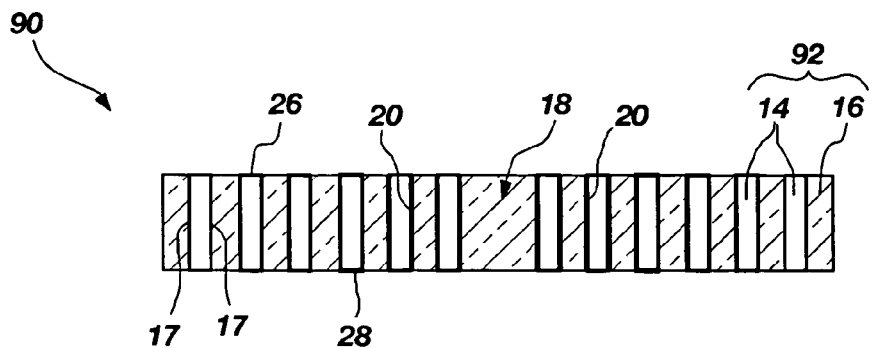
FIG. 10 is a cross-sectional view of the photonic crystal device shown in FIG. 9 taken along section line 10-10 therein.

As previously discussed, the gain material 20 of the photonic crystal device 90 is represented in FIGS. 9-10 by darker or bolder lines forming the voids 14. Voids 14 containing relatively more gain material 20 are represented by relatively darker or bolder lines relative to the lines forming voids 14 containing relatively less gain material 20. The gain material 20 may be configured to emit electromagnetic radiation having at least one particular wavelength upon stimulation. The at least one particular wavelength of electromagnetic radiation emitted by the gain material 20 may be within the photonic bandgap of the photonic crystal 92, but may correspond to an allowable mode within the waveguide 18. As seen in FIG. 9, the waveguide 18 may extend through the photonic crystal 92 in the Y direction. The gain material 20 may be localized along the length of the waveguide 18 in the Y direction. In other words, the gain material 20 may be provided in a plurality of voids 14 located within an enclosed two-dimensional area in the XY plane comprising a portion of the waveguide 18. Furthermore, voids 14 that are located relatively closer to the waveguide 18 may comprise more gain material 20 than voids 14 that are located relatively farther from the waveguide 18. In this configuration, the distribution of the gain material 20 in the photonic crystal 92 may vary in both the X direction and the Y direction within the photonic crystal 92.

FIG. 10 is a cross-sectional view of the photonic crystal device 90 taken along section line 10-10 shown in FIG. 9. As seen therein, each void 14 of the plurality of voids 14 may be at least partially defined by a cylindrical surface 17 of the dielectric material 16. Furthermore, the dielectric material 16 may be configured as a substantially planar layer having a first major surface 26 and a second major surface 28.

Each of the previously described photonic crystal devices includes a photonic crystal having a plurality of cylindrical voids formed in a dielectric material. In alternative embodiments of the invention, photonic crystals may be employed that include a plurality of rods comprising a dielectric material arranged in a periodic array or lattice with air or space provided between the rods.

Figure 11:
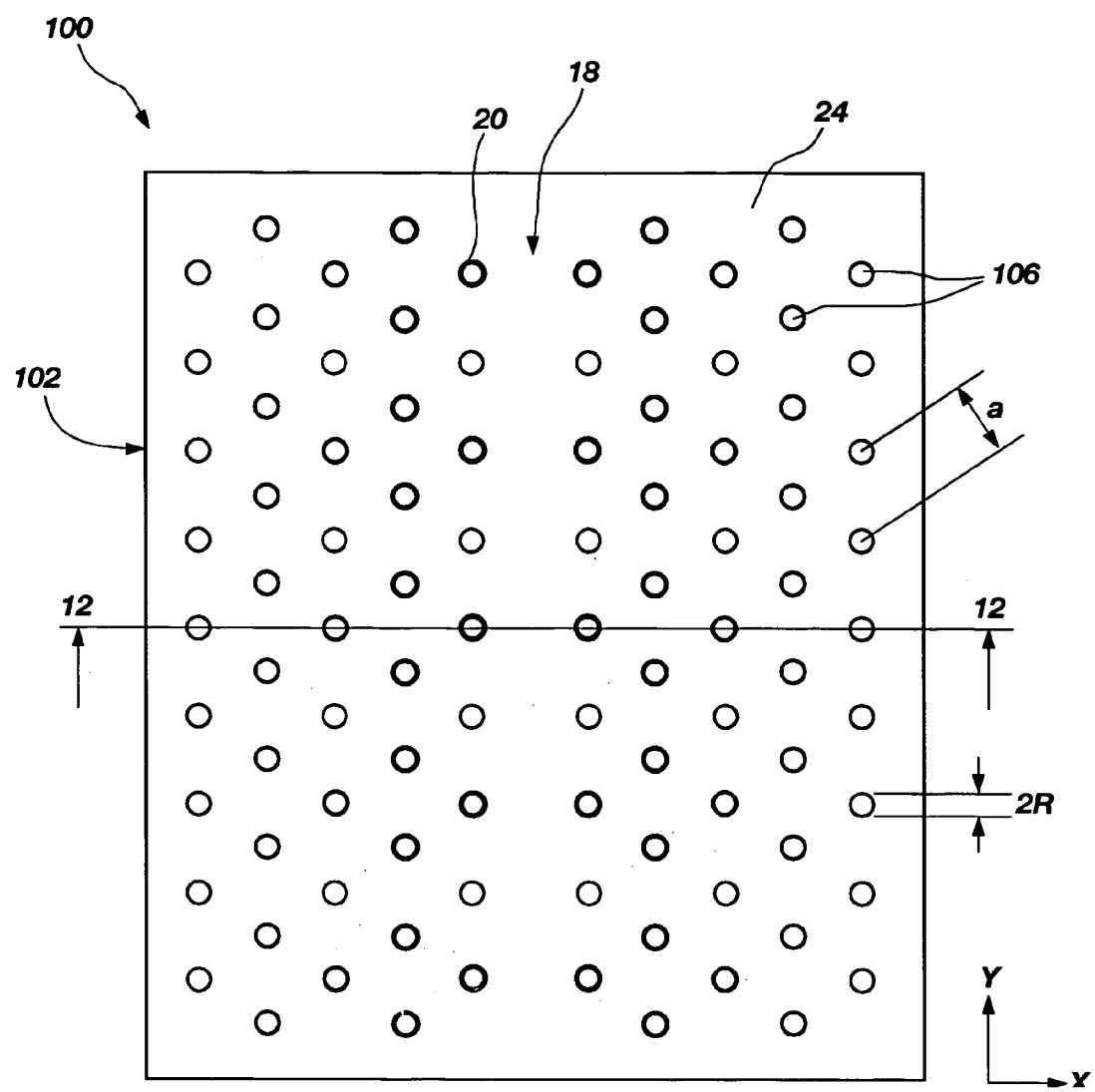
FIG. 11 is a plan view of yet another representative photonic crystal device that embodies teachings of the present invention.

Another photonic crystal device 100 that embodies teachings of the present invention is shown in FIG. 11. The photonic crystal device 100 includes a two-dimensional (2D) photonic crystal 102 having plurality of columns or rods 106 comprising a dielectric material disposed in a periodic array defining a triangular lattice. The dielectric material may be substantially homogenous throughout each rod 106. Space or air may be provided between the rods 106. At least one waveguide 18 may extend through the photonic crystal 102. Gain material 20 may be disposed on the cylindrically shaped lateral surfaces of a plurality of rods 106 that are located proximate the waveguide 18 of the photonic crystal 102. Additionally, the gain material 20 may be provided on the cylindrically shaped lateral surfaces of the rods 106 in any of the manners and configurations described previously herein in relation to the photonic crystal device 10 and FIGS. 1-8.

In one representative embodiment of the invention, the space or air between the rods 106 may have a dielectric constant of about 1 and the rods 106 may have a dielectric constant of about 11.4. For example, the rods 106 may be formed form GaAs and may have a uniform radius R. The triangular lattice may have a lattice constant a defined as the distance separating the center of one rod 106 from the center of adjacent rods 106. In this configuration, the ratio of the uniform radius R of the cylindrically shaped rods 106 to the lattice constant a of the photonic crystal 102 (i.e., R/a) may be in a range from about 0.1 to about 0.5. Dielectric periodicity may be exhibited throughout the photonic crystal 102 in directions within the XY plane.

The photonic crystal 102 may exhibit a photonic bandgap over a range of wavelengths of electromagnetic radiation. Certain electromagnetic modes at wavelengths within the photonic bandgap may be allowed within the waveguide.

Figure 12:
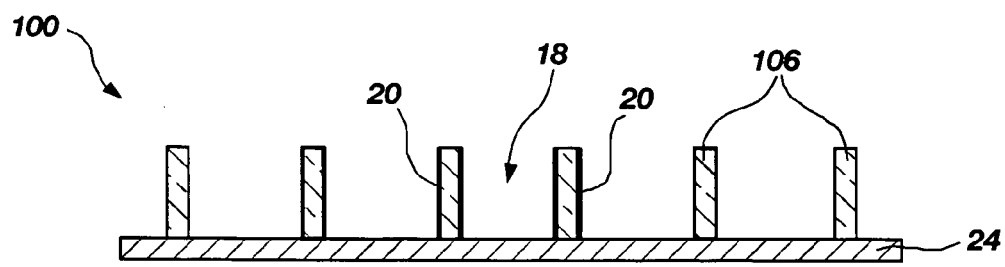
FIG. 12 is a cross-sectional view of the photonic crystal device shown in FIG. 11 taken along section line 12-12 therein.

The gain material 20 of the photonic crystal device 100 is represented in FIGS. 11-12 by darker or bolder lines forming the rods 106. Rods 106 having relatively more gain material 20 thereon are represented by relatively darker or bolder lines relative to the lines forming rods 106 having relatively less gain material 20 thereon. The gain material 20 may be configured to emit electromagnetic radiation having at least one particular wavelength upon stimulation. The at least one particular wavelength of electromagnetic radiation emitted by the gain material 20 may be within the photonic bandgap of the photonic crystal 102, but may correspond to an allowable mode within the waveguide 18. As seen in FIG. 11, the waveguide 18 may extend through the photonic crystal 102 in the Y direction. More gain material 20 may be provided on surfaces of rods 106 that are located closer to the waveguide 18 than on surfaces of rods 106 that are located farther from the waveguide 18. Furthermore, the amount of gain material 20 provided on surfaces of rods 106 in rows that extend in the Y direction proximate the waveguide 18 may vary in the Y direction. For example, gain material 20 may be provided on the surface of every alternating rod 106 in at least one or more rows of rods 106 extending in the Y direction proximate the waveguide 18. In this configuration, the distribution of the gain material 20 in the photonic crystal. 102 may vary in both the X direction and the Y direction within the photonic crystal 102.

FIG. 12 is a cross-sectional view of the photonic crystal device 100 taken along section line 12-12 shown in FIG. 11. As seen therein, each rod 106 may extend from a planar substrate 24 in a direction substantially perpendicular to the substrate 24. The rods 106 may be fabricated on a surface of the substrate 24. The gain material 20 may entirely cover the cylindrically shaped lateral surfaces of a plurality of rods 106 that are located proximate the waveguide 18 of the photonic crystal 102.

Photonic crystal devices that embody teachings of the present invention may be used to generate electromagnetic radiation and to couple that electromagnetic radiation to the waveguides 18 provided therein.

Figure 13:
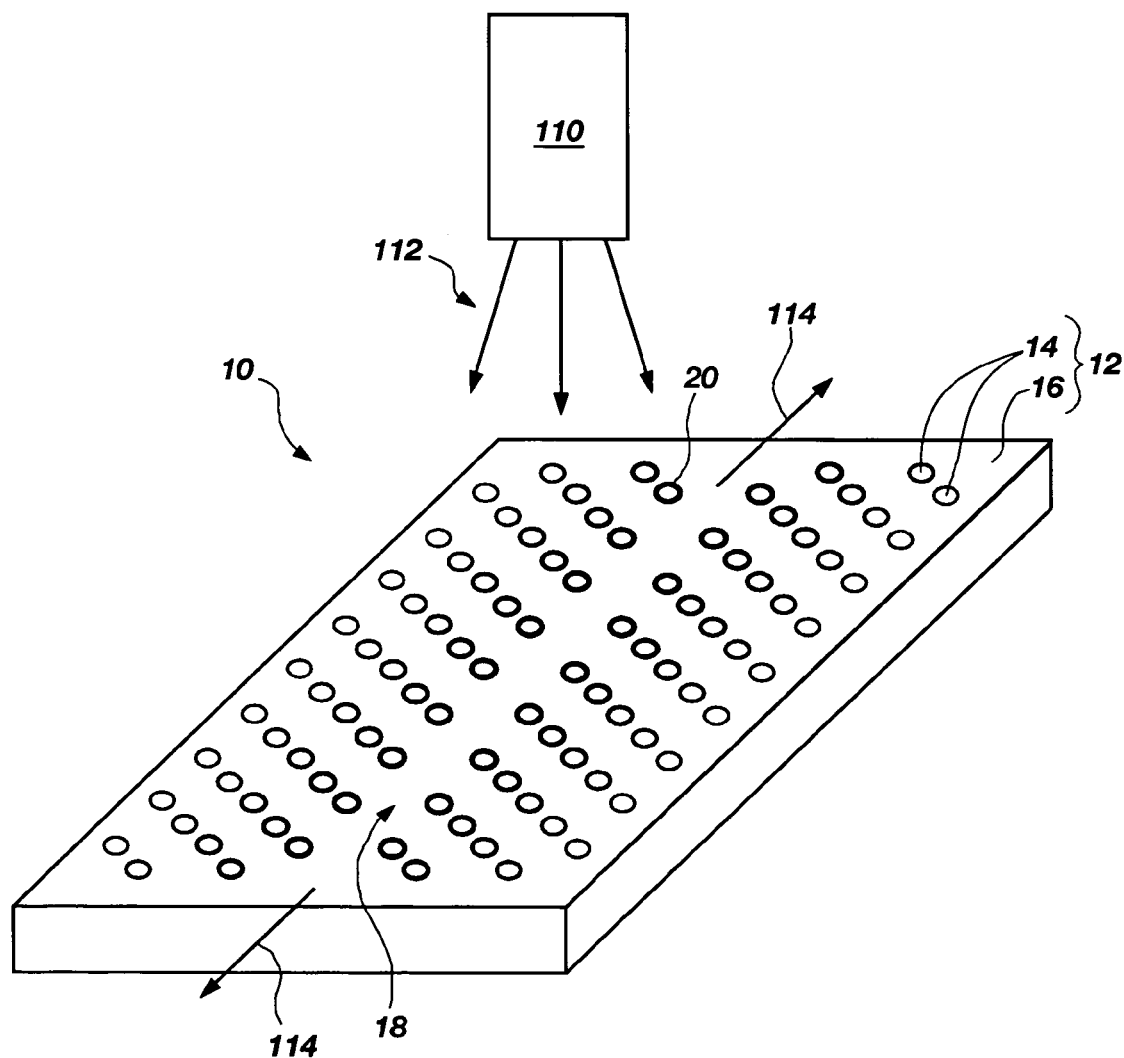
FIG. 13 is a perspective view of the photonic crystal device shown in FIGS. 1-3 illustrating principles of operation.

As seen in FIG. 13, a pump radiation source 110 may be provided and used to emit electromagnetic radiation 112 having a selected wavelength. The electromagnetic radiation 112 may be directed onto a surface of a photonic crystal device that embodies teachings of the present invention, such as, for example, the photonic crystal device. 10 shown in FIGS. 1-4. The electromagnetic radiation 112 may stimulate the gain material 20 of the photonic crystal device 10 to emit radiation (not shown). The radiation emitted by the gain material 20 may couple to the waveguide 18 of the photonic crystal 12 and may propagate through the waveguide in at least one of the directions indicated by directional arrows 114.

By varying the distribution of gain material in two-dimensional photonic crystals in at least one direction in the XY plane, a desired pattern of gain material may be selected and provided to enhance and optimize propagation of electromagnetic radiation generated by the gain material through a waveguide that extends through the photonic crystal proximate the gain material. Furthermore, the photonic crystal devices that embody teachings of the present invention may be configured to exhibit either a positive refractive index or a negative refractive index, as is known in the art.

Although the foregoing description contains many specifics, these are not to be construed as limiting the scope of the present invention, but merely as providing certain representative embodiments. Similarly, other embodiments of the invention can be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are encompassed by the present invention.

What is claimed is:

1. A device comprising:
   a photonic crystal comprising:
      a dielectric material;
      a plurality of voids in the dielectric material, the plurality of voids being disposed in a periodic lattice throughout the dielectric material, each void of the plurality of voids being at least partially defined by at least one surface of the dielectric material; and
      a waveguide; and
   gain material disposed within at least one void located proximate the waveguide, wherein the gain material is configured to emit electromagnetic radiation upon stimulation, the electromagnetic radiation having a wavelength that is within a photonic bandgap of the photonic crystal, the wavelength corresponding to an allowable electromagnetic mode of the waveguide.

2. The device of claim 1, wherein the gain material is disposed on at least a portion of a surface of the dielectric material within the at least one void located proximate the waveguide.

3. The device of claim 1, wherein the photonic crystal is configured as a two-dimensional photonic crystal, the dielectric material comprising a substantially planar layer of dielectric material having a first major surface and a second major surface.

4. The device of claim 3, wherein the plurality of voids are arranged in a triangular lattice or a square lattice.

5. The device of claim 4, wherein each void of the plurality of voids has a substantially cylindrical shape, each void being at least partially defined by a cylindrical surface of the dielectric material extending between the first major surface and the second major surface of the substantially planar layer of dielectric material.

6. The device of claim 1, further comprising a plurality of quantum well structures disposed within a plurality of voids located proximate the waveguide, at least one quantum well structure being disposed in each void of the plurality of voids located proximate the waveguide, each quantum well structure comprising the gain material.

7. The device of claim 6, wherein the at least one quantum well structure disposed in each void of the plurality of voids located proximate the waveguide completely covers each surface of the dielectric material that at least partially defines each void.

8. The device of claim 6, wherein at least some of the quantum well structures of the plurality of quantum well structures comprise multiple quantum well structures.

9. The device of claim 1, further comprising a plurality of nanoparticles disposed within the at least one void located proximate the waveguide, each nanoparticle of the plurality of nanoparticles comprising the gain material.

10. The device of claim 9, wherein the plurality of nanoparticles comprises a plurality of nanowires.

11. The device of claim 1, wherein the gain material comprises a semiconductor material.

12. The device of claim 1, wherein the gain material is disposed within a plurality of voids located proximate the waveguide.

13. The device of claim 12, wherein a quantity of gain material is disposed within voids located closer to the waveguide that is greater than a quantity of gain material disposed within voids located farther from the waveguide.

14. The device of claim 1, wherein the photonic crystal is configured to exhibit a positive refractive index.

15. A device comprising:
   a two-dimensional photonic crystal comprising:
      a layer of dielectric material having a first major surface and a second major surface;
      a plurality of voids disposed in a lattice in the layer of dielectric material, each void of the plurality of voids extending through the layer of dielectric material between the first major surface and the second major surface; and
      a linear defect in the lattice defining a waveguide; and
   at least one structure comprising gain material disposed within each void of a plurality of voids located proximate the waveguide, the gain material being configured to emit electromagnetic radiation upon stimulation, the electromagnetic radiation having a wavelength that is within a photonic bandgap of the photonic crystal, the wavelength corresponding to an electromagnetic mode that is allowable within the waveguide.

16. The device of claim 15, wherein the at least one structure comprising gain material comprises a nanoparticle or a quantum well structure.

17. The device of claim 15, wherein the gain material comprises a semiconductor material.

18. The device of claim 15, wherein voids located closer to the waveguide comprise more gain material than voids located farther from the waveguide.

19. A method for coupling electromagnetic radiation to a waveguide comprising:
   providing a photonic crystal comprising:
      a dielectric material;
      a plurality of voids in the dielectric material, the plurality of voids being disposed in a periodic lattice throughout the dielectric material, each void of the plurality of voids being at least partially defined by at least one surface of the dielectric material; and
      a waveguide extending through the photonic crystal;
   providing a gain material within at least one void located proximate the waveguide, the gain material being configured to emit electromagnetic radiation upon stimulation, the electromagnetic radiation having a wavelength that is within a photonic bandgap of the photonic crystal, the wavelength corresponding to an electromagnetic mode that is allowable within the waveguide; and
   stimulating the gain material to emit electromagnetic radiation.

* * * * *